(12) United States Patent
Chang

(10) Patent No.: US 10,334,726 B1
(45) Date of Patent: Jun. 25, 2019

(54) CIRCUIT BOARD WITH A SUBSTRATE MADE OF SILICON AND THE METHODS FOR FORMING THE SAME

(71) Applicant: Wen Yao Chang, Taipei (TW)

(72) Inventor: Wen Yao Chang, Taipei (TW)

( * ) Notice: Subject to any disclaimer, the term of this patent is extended or adjusted under 35 U.S.C. 154(b) by 0 days.

(21) Appl. No.: 15/841,320

(22) Filed: Dec. 14, 2017

(51) Int. Cl.
*H05K 1/03* (2006.01)
*H05K 3/12* (2006.01)
*H05K 1/09* (2006.01)
*H05K 3/32* (2006.01)
*H05K 1/18* (2006.01)

(52) U.S. Cl.
CPC ............... *H05K 1/036* (2013.01); *H05K 1/09* (2013.01); *H05K 1/186* (2013.01); *H05K 3/1216* (2013.01); *H05K 3/32* (2013.01); *H05K 2203/0502* (2013.01)

(58) Field of Classification Search
CPC ...................................................... H05K 1/036
See application file for complete search history.

(56) References Cited

U.S. PATENT DOCUMENTS

2015/0257263 A1* 9/2015 Sethumadhavan .. H05K 1/0366
257/88

* cited by examiner

*Primary Examiner* — Daniel H Lee

(57) ABSTRACT

A circuit board with a substrate made of silicon includes a silicon substrate made of silicon; an adhering layer which is a gluing layer and is adhered on the silicon substrate; and a metal layer formed as a metal plate layer or a metal circuit layer; the metal layer being adhered on the adhering layer. Furthermore, the method for forming the circuit board with silicon substrate is proposed, in that a method for forming a circuit board suitable for etching and a method for forming a circuit board for screen printing are proposed.

4 Claims, 7 Drawing Sheets

CIRCUIT BOARD WITH A SUBSTRATE MADE OF SILICON AND THE METHODS FOR FORMING THE SAME

FIELD OF INVENTION

The present invention relates to circuit board materials, and in particular to a circuit board with a substrate made of silicon and the methods for forming the same.

BACKGROUND OF THE INVENTION

As shown in FIG. 1, the conventional printed circuit is made of PET or PI boards (films) which is made as a substrate 10'. Then a metal layer 30' is adhered to the substrate 10' by using an adhesive layer 20'. Material of the metal layer 30' is selected from copper, silver, gold, etc. If packaging is necessary, silicon 40' is added to the printed circuit.

Generally, printed circuits are classified as hard boards and soft boards. The hard boards are made of FR4, aluminum, or ceramics. The soft boards are made of PET, PI, etc. The structure of soft boards has some defects in practical usages. The main reasons are that PET or PI are not usable in high temperatures over 130° C. This high temperature will induce deformation of the circuit or the electric properties of the elements on the circuit boards are shifted, for example, impedances are changed so that precise data transfer cannot be achieved.

The extension property of PET or PI is not preferable. In many applications, for example, biological chips, these circuit boards are not suitable due to bad extension property.

Therefore, the present invention desired to provide a novel invention which can improve above mentioned defects.

SUMMARY OF THE INVENTION

To improve above defects in the prior art, the present invention provides a circuit board with a substrate made of silicon and the methods for forming the same, wherein

DETAILED DESCRIPTION OF THE INVENTION

Figure 1:
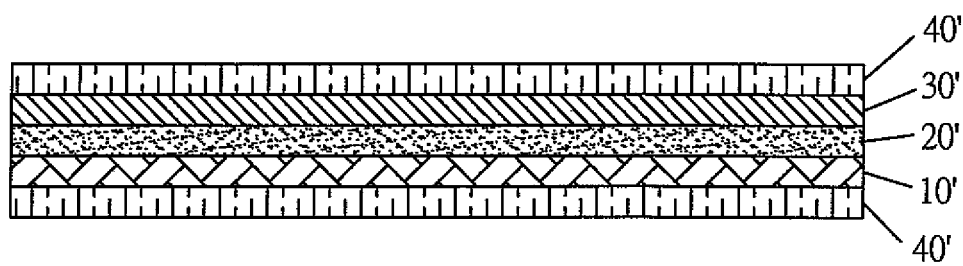
FIG. 1 is a cross sectional view of a prior art printed circuit board.
Figure 2A:
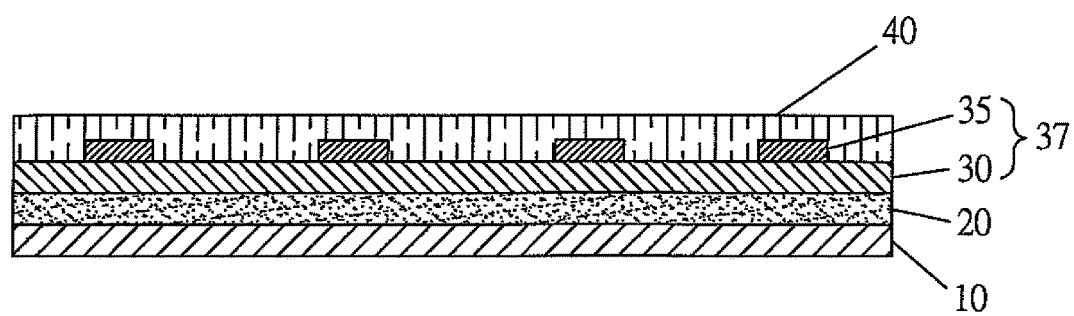
FIG. 2A shows a schematic cross section view of the present invention.
Figure 2B:
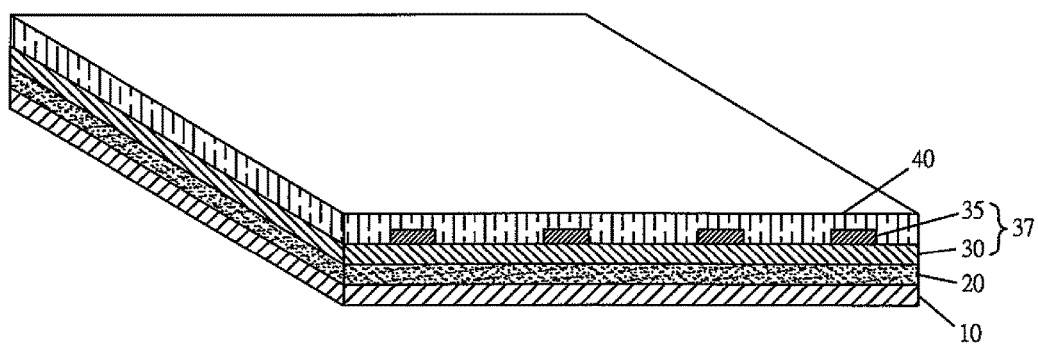
FIG. 2B is a perspective schematic view of the present invention.

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 2A to 4, the structures of the present invention are shown. The present invention is related to a circuit board with a substrate made of silicon which includes following elements.

A silicon substrate 10 (With reference to FIGS. 2A and 2B) is made of silicon which is more extensible and flexible than PET substrate. Furthermore, silicon is tolerable with temperatures higher than 200° C.

An adhering layer 20 is adhered on the silicon substrate 10. Materials of the adhering layer 20 contain Organic silicon polyester copolymer resin, Ethyl acetate and Organic silicon resin.

A metal layer 30 is formed as a metal plate layer or a metal circuit layer. If the metal layer 30 is formed as a metal plate layer, it can be formed as circuits by etching or screen printing. The metal layer 30 is adhered on the adhering layer 20. Material of the metal layer 30 is selected from metals such as copper, aluminum, sliver, gold, etc. Practically, other electronic elements 35 may be arranged on the metal layer 30 (as shown in the schematic view of FIG. 2) so as to form as a functional circuit.

If in packaging, a packaging silicon layer 40 encapsulates the metal layer 30 (maybe including the electronic elements 35 thereon) for packaging the metal layer 30 and the electronic elements 35 thereon.

Figure 3:
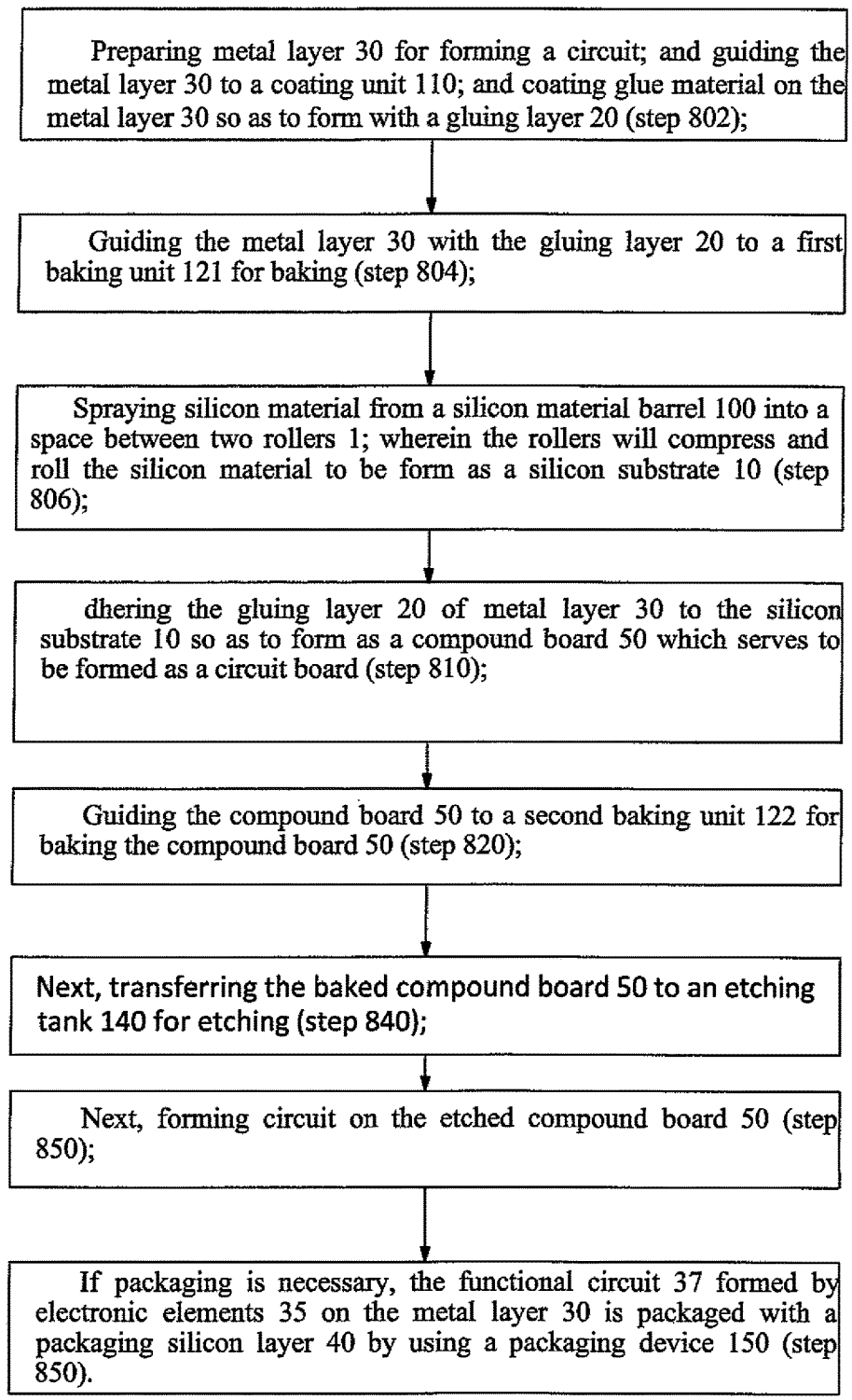
FIG. 3 shows the manufacturing process of the present invention.
Figure 4:
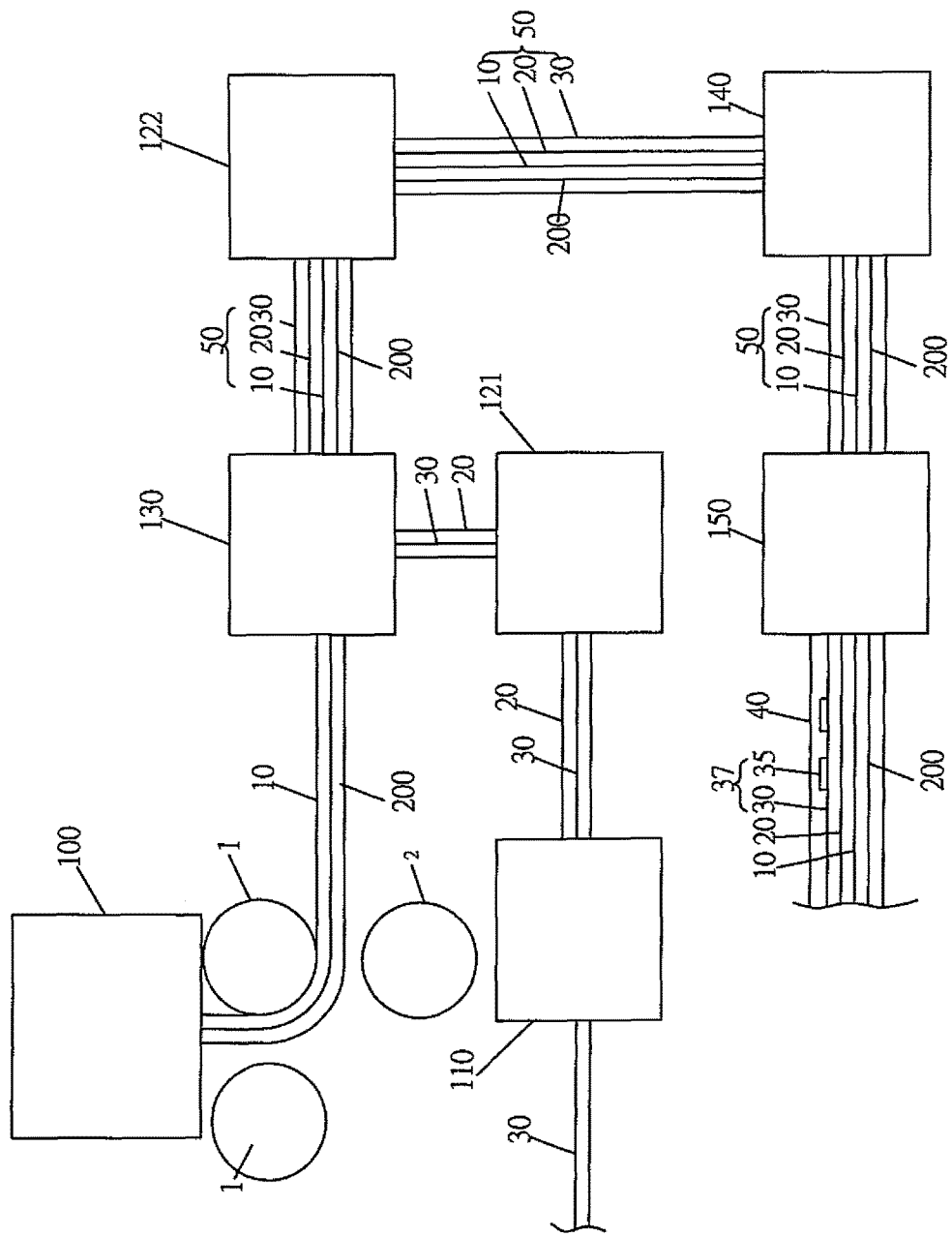
FIG. 4 is a schematic view showing the etching process of the present invention.

With reference to FIGS. 3 and 4, a manufacturing process for forming an etching circuit board on the silicon substrate is illustrated. The process will be described herein. The process comprises the following step of:

Preparing metal layer 30 for forming a circuit; and guiding the metal layer 30 to a coating unit 110; and coating glue material on the metal layer 30 so as to form with a gluing layer 20 (step 802);

Guiding the metal layer 30 with the gluing layer 20 to a first baking unit 121 for baking (step 804);

Spraying silicon material from a silicon material barrel 100 into a space between two rollers 1; wherein the rollers compress and roll the silicon material to be formed as a silicon substrate 10 with a predetermined width (step 806);

The two rollers 2 and a transferring belt 200 guiding the silicon substrate 10 to a metal adhering unit 130, and meanwhile guiding the metal layer 30 with the gluing layer 20 to the metal adhering unit 130; adhering the gluing layer 20 of metal layer 30 to the silicon substrate 10 so as to form as a compound board 50 which serves to be formed as a circuit board (step 810);

Guiding the compound board 50 to a second baking unit 122 for baking the compound board 50 (step 820);

In the present invention, the compound board 50 may be a plate like structure or be curled for storage or transferring. If necessary, the curled compound board 50 can be straightened for forming circuits or packaging in the succeeding process.

Next, transferring the baked compound board 50 to an etching tank 140 for etching (step 840); wherein liquid for etching may be alkaline or acidic, for example, copper chloride.

Next, forming circuit on the etched compound board 50 (step 850); these steps are known in the arts, and thus the details will not be further described herein.

If packaging is necessary, the functional circuit 37 formed by electronic elements 35 on the metal layer 30 is packaged with a packaging silicon layer 40 by using a packaging device 150 (step 850).

Figure 5:
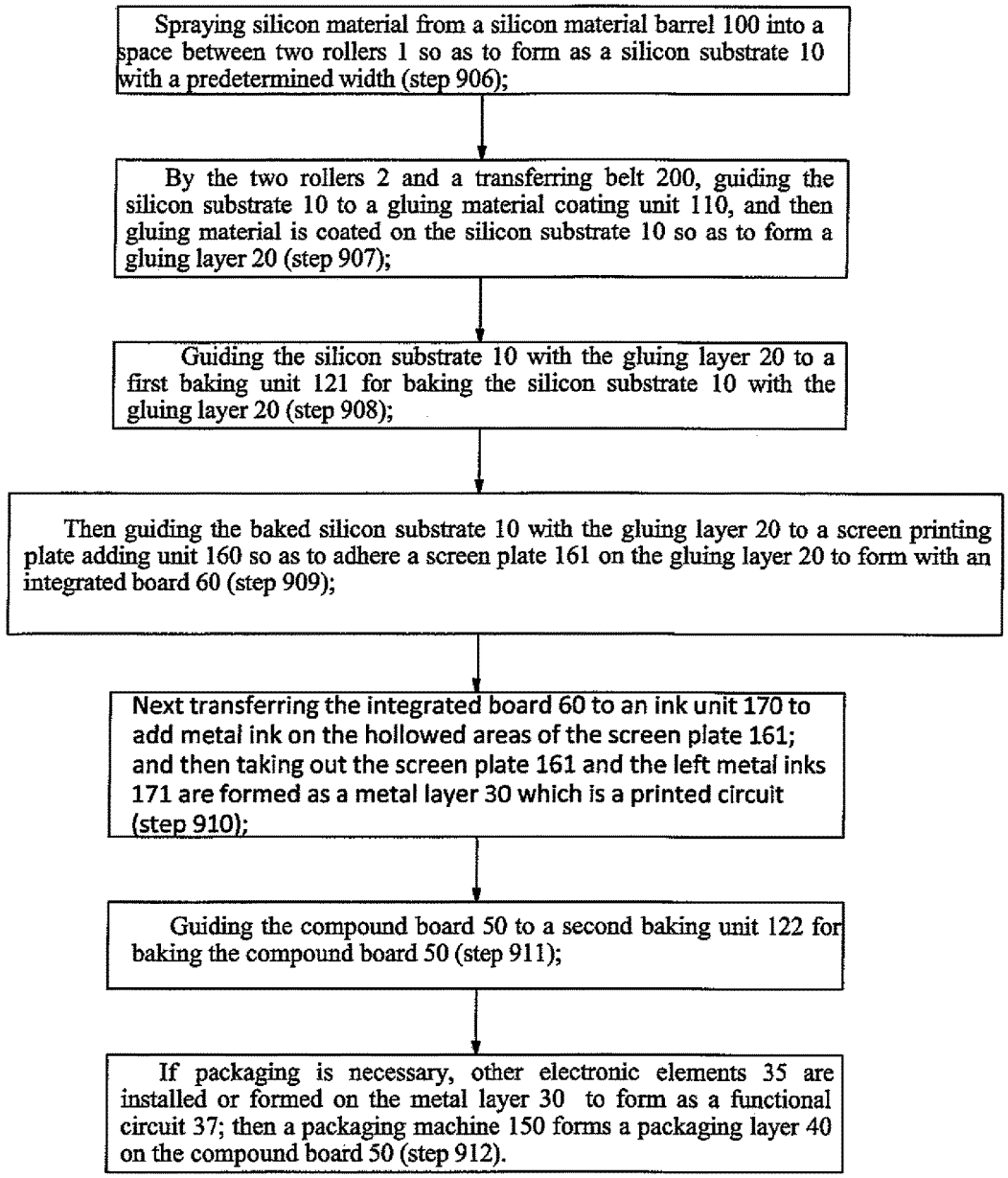
FIG. 5 is a flow diagram about the manufacturing method when the present invention is applied to screen printing.
Figure 6:
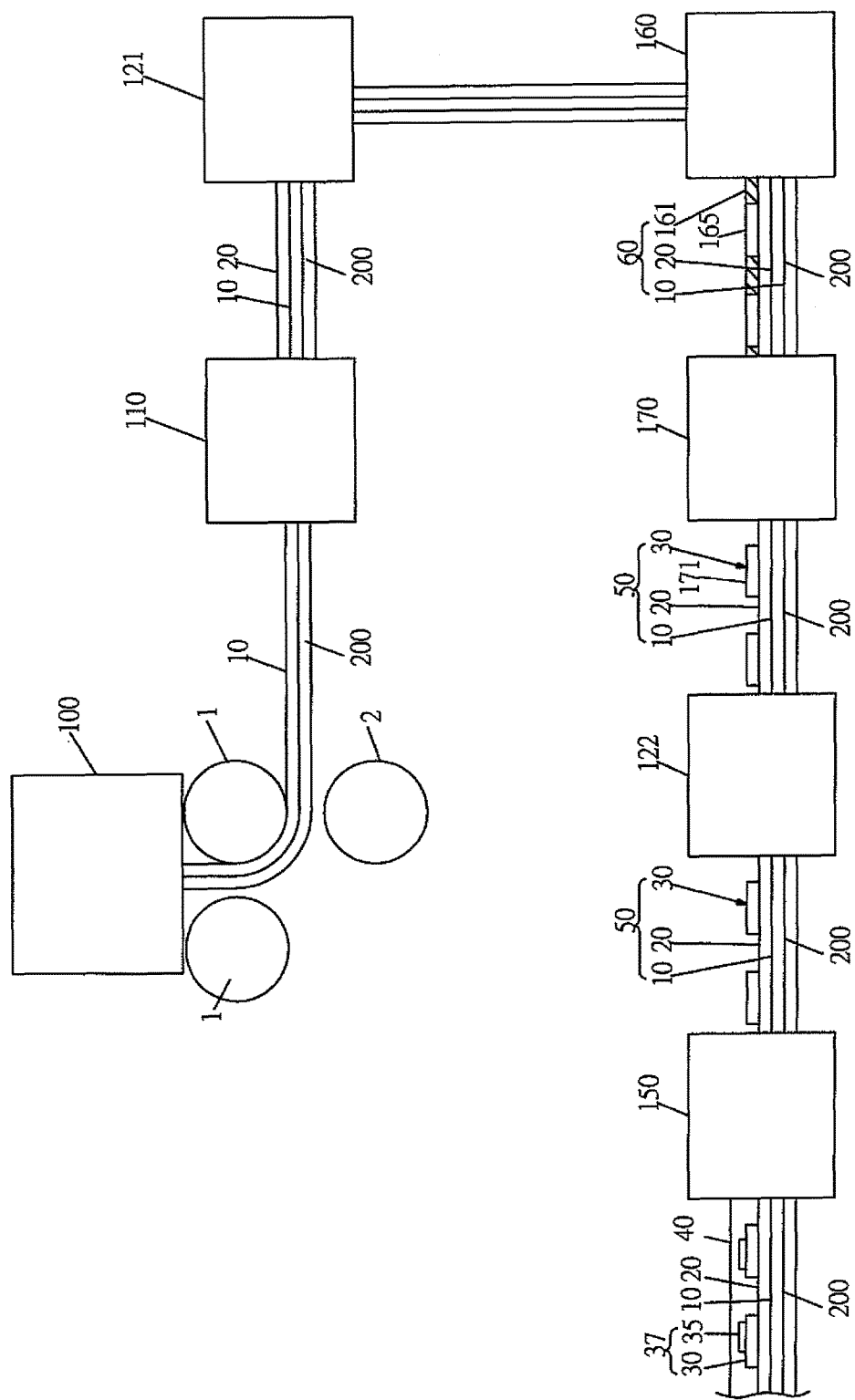
FIG. 6 is a schematic view which shows that the present invention is applied to screen printing.

With reference to FIGS. 5 and 6, the process for forming printed circuit board on the silicon substrate will be described herein.

Spraying silicon material from a silicon material barrel 100 into a space between two rollers 1; wherein the rollers compress and roll the silicon material to be formed as a silicon substrate 10 with a predetermined width (step 906);

The two rollers 2 and a transferring belt 200 guiding the silicon substrate 10 to a gluing material coating unit 110, and then gluing material is coated on the silicon substrate 10 so as to form a gluing layer 20 (step 907);

Guiding the silicon substrate 10 with the gluing layer 20 to a first baking unit 121 for baking the silicon substrate 10 with the gluing layer 20 (step 908).

Then guiding the baked silicon substrate 10 with the gluing layer 20 to a screen printing plate adding unit 160 so as to adhere a screen plate 161 on the gluing layer 20 to form with an integrated board 60; wherein the screen plate 161 has hollowed areas 165 for forming circuits in the succeeding process (step 909).

Next transferring the integrated board 60 to an ink unit 170 to add metal ink on the hollowed areas of the screen plate 161; and then taking out the screen plate 161 and the metal inks 171 are formed as a metal layer 30 which is a printed circuit. In that, the metal layer 30, the silicon substrate 10 and the gluing layer 20 are formed as a compound board 50 (step 910). The metal inks 181 are selected from metal materials, such as copper, aluminum, silver, gold, etc.

Guiding the compound board 50 to a second baking unit 122 for baking the compound board 50 (step 911).

If packaging is necessary, other electronic elements 35 are installed or formed on the metal layer 30 (those shown on the drawings are only schematic views) to form as a functional circuit 37; and then a packaging machine 150 forms a packaging layer 40 on the compound board 50 (step 912).

In the present invention, a silicon substrate is used to replace conventional substrates which use PET or PI. The silicon is more extensible and flexible than the prior art PET substrate. Furthermore silicon substrate is bendable so that it is suitable for forming bendable circuit board. Silicon has low dielectric coefficient which is suitable as substrates for antennas or other wireless circuits. Furthermore, the temperature tolerance of silicon substrate is over 200 degree C. so that the present invention is usable in high temperatures, such as medical usages. Generally, high temperature sterilization is over 160 degrees, but the conventional PET or PI substrates cannot be used under such temperatures. Moreover, the silicon substrate 10 is water proof and heat tolerant so that they can be used in various environments and thus productions of silicon substrates are easily. Further, silicon substrates are difficult to react chemically with other biological organs, and thus they are suitable in applications of biologics, such as forming as biological chips.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for forming a circuit board with a substrate made of silicon, comprising following steps of:

spraying silicon material from a silicon material barrel into a space between two rollers; wherein the rollers compress and roll the silicon material to be formed as a silicon substrate with a predetermined width;

the two rollers and a transferring belt guiding the silicon substrate to a gluing material coating unit, and then gluing material being coated on the silicon substrate so as to form a gluing layer;

guiding the silicon substrate with the gluing layer to a first baking unit for baking the silicon substrate with the gluing layer;

guiding the baked silicon substrate with the gluing layer to a screen printing plate adding unit so as to adhere a screen plate on the gluing layer to form with an integrated board; wherein the screen plate has hollowed areas for forming circuits in the succeeding process;

transferring the integrated board to an ink unit to add metal ink on the hollowed areas of the screen plate; and then taking out the screen plate and, the metal ink being formed as a metal layer which is a printed circuit; in that, the metal layer, the silicon substrate and the gluing layer are formed as a compound board; and guiding the compound board to a second baking unit for baking the compound board.

2. The method of claim 1, further comprising the step of: installing or forming other electronic elements on the metal layer to form as a functional circuit; and then a packaging machine forming a packaging layer on the compound board.

3. The method of claim 1, wherein materials of the gluing layer contains Organic silicon polyester copolymer resin, ethyl acetate and organic silicon resin.

4. The method of claim 1, wherein material of the metal layer is selected from copper, aluminum, silver, and gold.

* * * * *